United States Patent [19]

O'Mara, Jr. et al.

[11] Patent Number: 5,306,650
[45] Date of Patent: Apr. 26, 1994

[54] METHOD OF MAKING SILICON MESFET FOR DIELECTRICALLY ISOLATED INTEGRATED CIRCUITS

[75] Inventors: William E. O'Mara, Jr., Kingston, N.H.; James D. Beasom, Melbourne Village, Fla.

[73] Assignee: Harris Corporation, Melbourne, Fla.

[21] Appl. No.: 606,193

[22] Filed: Oct. 31, 1990

Related U.S. Application Data

[62] Division of Ser. No. 523,427, May 15, 1990, Pat. No. 5,014,108.

[51] Int. Cl.⁵ .......................................... H01L 21/265
[52] U.S. Cl. ...................................... 437/39; 437/62; 257/280
[58] Field of Search ............................ 437/39, 62, 68; 257/256, 280

[56] References Cited

U.S. PATENT DOCUMENTS

| | | | |
|---|---|---|---|
| 3,722,079 | 3/1973 | Beasom | 437/62 |
| 3,755,012 | 8/1973 | George et al. | 437/62 |
| 4,185,291 | 1/1980 | Hirao et al. | 257/285 |
| 4,187,514 | 2/1980 | Tomisawa et al. | 257/256 |
| 4,260,431 | 4/1981 | Piotrowski | 437/39 |
| 4,287,526 | 9/1981 | Sakuma | 257/353 |
| 4,456,918 | 6/1984 | Beasom | 257/272 |
| 4,495,694 | 1/1985 | Beasom | 437/148 |
| 4,532,003 | 7/1985 | Beasom | 437/68 |
| 4,546,539 | 10/1985 | Beasom | 432/31 |
| 4,587,656 | 5/1986 | Hartman et al. | 257/134 |
| 4,603,469 | 8/1986 | Armiento et al. | 437/40 |
| 4,665,425 | 5/1987 | Piotrowski | 257/525 |
| 4,783,688 | 11/1988 | Shannon | 257/280 |
| 4,929,568 | 5/1990 | Beasom et al. | 437/40 |
| 4,948,746 | 8/1990 | Beasom | 437/39 |

FOREIGN PATENT DOCUMENTS

61-1810  1/1986  Japan .
116996   7/1989  Japan .

OTHER PUBLICATIONS

"Self Isolating Bathtub Collector For A Planar Transistor", by J. E. Ziegler, et al.; IBM Bulletin, vol. 14, No. 5, Oct. 1971.

Primary Examiner—Olik Chaudhuri
Assistant Examiner—Long Pham
Attorney, Agent, or Firm—Barnes & Thornburg

[57] ABSTRACT

A MESFET wherein a Schottky top gate which extends across the channel region between the source and drain regions and beyond sides of the dielectric isolation in which the device is built at two points. The bottom gate also extends beyond the dielectric isolation below the surface of the island and intersects the bottom of the source and drain regions. Where a bottom gate contact region forms an annulus encompassing the source and drain, the top gate extends across the channel and only onto sides of the bottom gate contact region at two points. The source and drain regions which are formed are sufficiently spaced from the dielectric isolation so as not to effect the $I_{DSS}$ resulting from variation in the island size.

9 Claims, 2 Drawing Sheets

METHOD OF MAKING SILICON MESFET FOR DIELECTRICALLY ISOLATED INTEGRATED CIRCUITS

This is a divisional of application Ser. No. 07/523,427, filed May 15, 1990, now U.S. Pat. No. 5,014,108.

BACKGROUND AND SUMMARY OF THE INVENTION

The present invention relates generally to field effect transistors and more specifically to an improved radiation hard MESFET.

Junction isolated, junction field effect transistors (JFET) generally include a source and drain region spaced from each other by a channel region. Surrounding the source and drain region is a high impurity region which acts not only as a guard ring, but as a contact to the bottom gate region which extends below the channel and between the source and drain regions to define the bottom of the channel. The top gate is generally a diffused region of opposite conductivity type to the channel region. By appropriately biasing the top and bottom gates, the channel between the source and drain regions is interrupted. The top gate is generally connected to the bottom gate by extending the top gate diffusion across the channel and into the bottom gate contact. A typical example is shown in U.S. Pat. No. 4,187,514.

In environments which require radiation hard devices, total dose radiation causes inversion around the top gate. This is detrimental to the operation of the JFETs and is undesirable.

Another form of junction field effect transistors is a metal Schottky junction field effect transistor (MESFET). The top gate is of a material which forms a Schottky barrier with the channel region.

Thus, it is an object of the present invention to provide a radiation hard field effect transistor.

Another object of the present invention is to provide a MESFET which is radiation hard.

An even further object of the present invention is to provide a leakage free MESFET.

An even further object of the present invention is to provide a MESFET whose operating characteristics are not effected by variations in dielectric isolated island size.

These and other objects of the invention are attained by using a Schottky top gate which extends across the channel region between the source and drain regions and beyond sides of the dielectric isolation in which the device is built at two points. The bottom gate also extends beyond the dielectric isolation below the surface of the island and intersects the bottom of the source and drain regions. The length of the Schottky barrier top gate and the bottom gate diffusion are sufficiently large so as to extend beyond the dielectric isolation for the maximum anticipated island size which results from the dielectric isolation process. Thus, the top and bottom gates completely define the channel and prevent any leakage current beyond the gates. The source and drain regions which are formed are sufficiently spaced from the dielectric isolation so as not to effect the $I_{DSS}$ resulting from variation in the island size. A substrate contact is provided to bias the substrate and turn off a parasitic PMOS device between the top and bottom gates.

A bottom gate contact region may be provided extending from the surface down to the bottom gate exterior the channel region defined by the source and drain regions. Preferably, this bottom gate contact region is formed as an annulus encompassing the source and drain regions. In such an application, where it is desirable to connect the top and bottom gates together, the Schottky top gate need only extend across the channel and onto the bottom gate contact region at two points. With this annulus structure, the MESFET structure may be used in other isolated islands whether they be junction or dielectrically isolated.

Other objects, advantages and novel features of the present invention will become apparent from the following detailed description of the invention when considered in conjunction with the accompanying drawings.

DETAILED DESCRIPTION OF THE DRAWINGS

Figure 1:
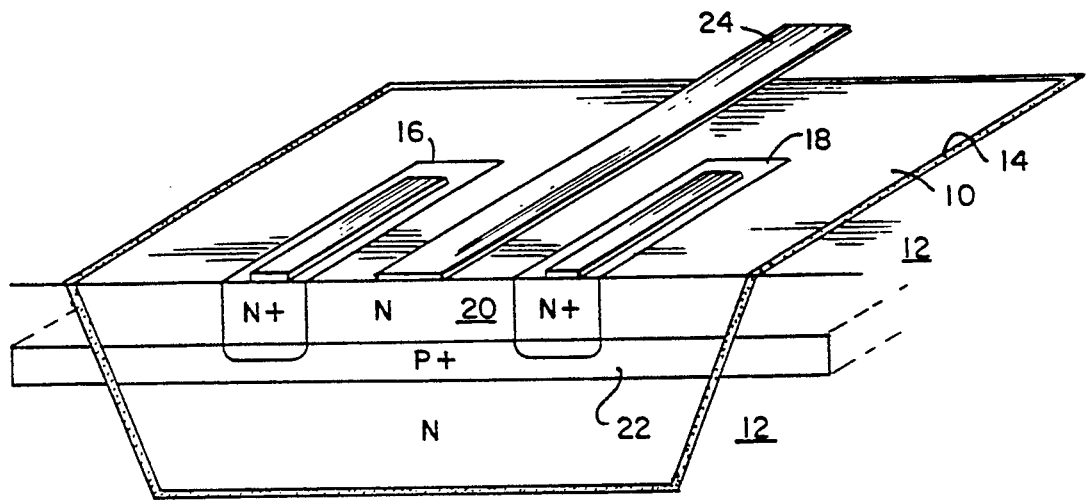
FIG. 1 is a cut-away perspective of a MESFET according to the principles of the present invention.
Figure 2:
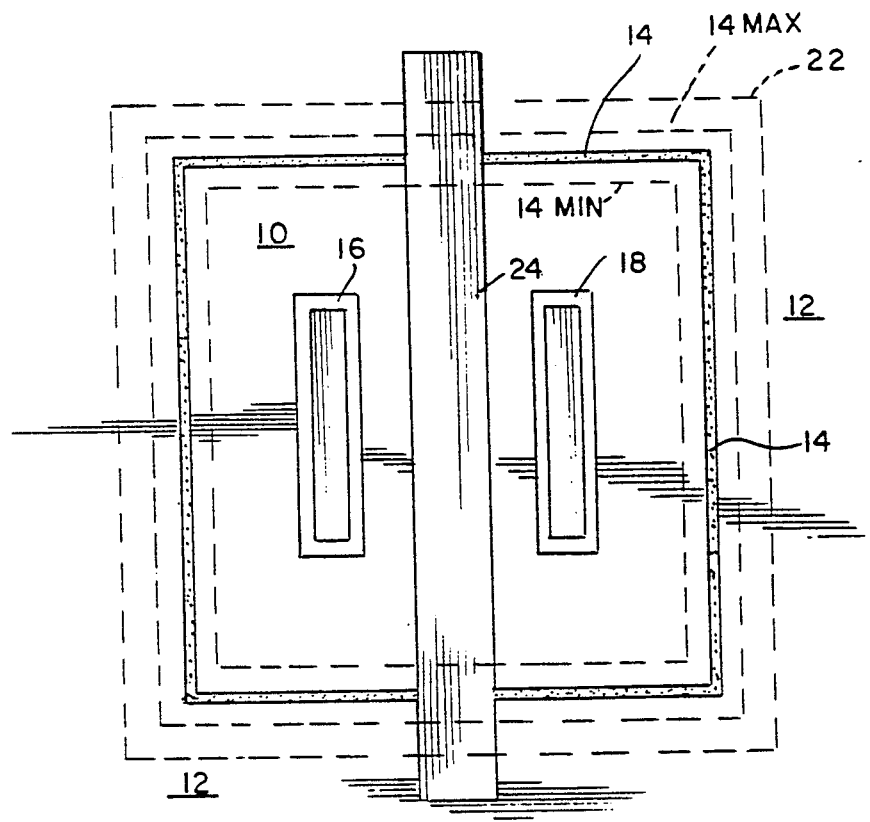
FIG. 2 is a plan view of the MESFET of FIG. 1.

A MESFET is shown in FIGS. 1 and 2 as being formed in a semiconductor island 10 separated from a substrate 12 by dielectric isolation 14. For purposes of example, the island 10 and has an N conductivity impurity type. N+ source and drain regions 16 and 18 are formed spaced in the island 10 and separated from each other by portion 20 of the island 10 which forms the channel of the MESFET. A P+ bottom gate region 22 is formed in and below the surface of the island 10. The bottom gate 22 intersects the bottom of the source and drain regions 16 and 18 and extends outside the dielectric isolation 14. Thus, the bottom gate 22 defines the bottom of the channel region.

The top gate 24 is of a material which forms a Schottky barrier with the channel region 20 which is silicon. The gate material 24 would be selected from the group of two percent silicon doped aluminum, W, Pt Si, W Si, etc. The top gate 24 extends across the channel region 20 and outside opposed sides of the dielectric isolation 14. Thus, the gate extends across all possible channel regions at the surface of the island 10 and prevents any leakage or parasitic devices.

Figure 3:
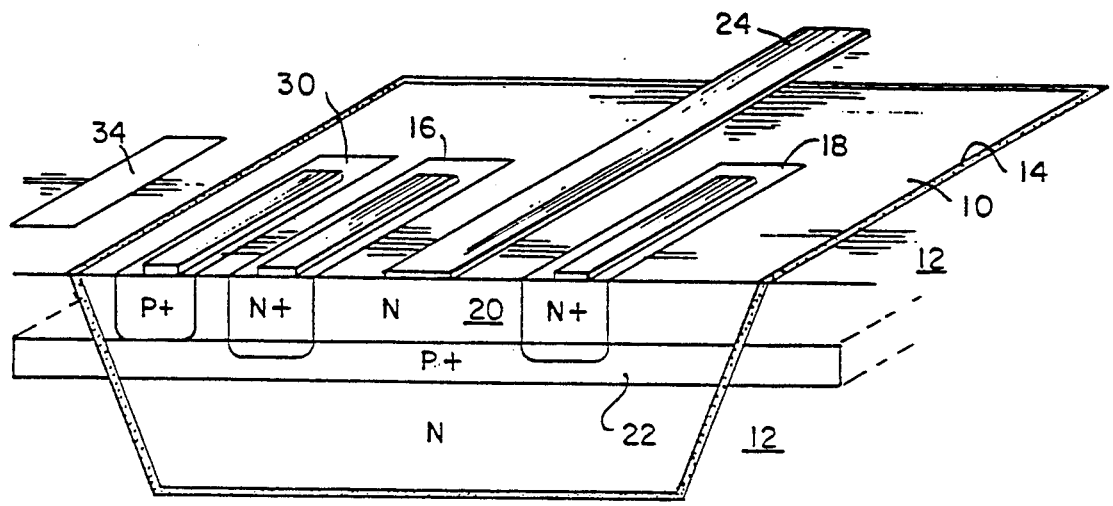
FIG. 3 is a cut-away perspective of a MESFET incorporating a bottom gate contact region according to the principles of the present invention.

The bottom or back gate 22 formed by the P+ implant is electrically floating in FIGS. 1 and 2. In many applications this is undesirable. Electrical connection can be achieved by adding a P region 30 which extends from the substrate or island surface down to and intersects the P+ bottom gate 22 as illustrated in FIG. 3. Separate contact can be made to the bottom gate through bottom gate contact region 30 and to the top gate through top gate metal 24.

Figure 4:
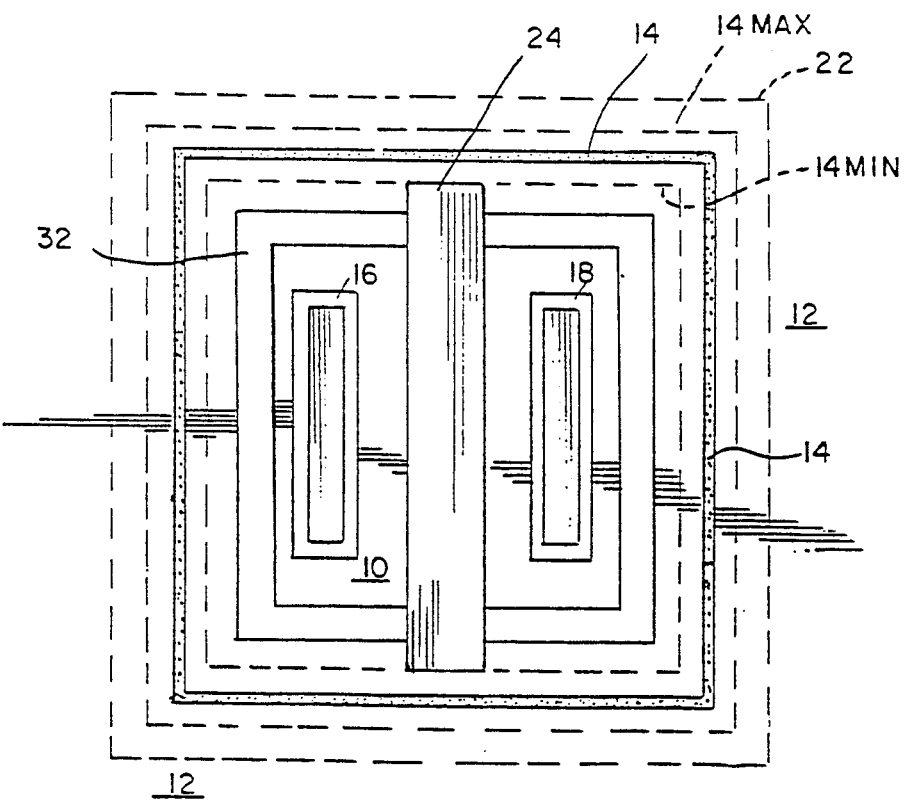
FIG. 4 is a plan view of a MESFET including an annulus bottom gate contact region according to the principles of the present invention.

If connection of the top gate to the bottom gate is desirable or acceptable, the bottom gate contact region may be formed as an annulus extending down to the bottom gate 22 surrounding the source and drain regions. This is illustrated as P region 32 in FIG. 4. In this embodiment, the Schottky top gate 24 extends across the channel region and onto the P+ top gate annulus 32 at opposing sides. The top gate metal 24 need not extend over the island edge or isolation region 14 as in the other embodiments. The ring 32 should be formed inside the smallest expected or minimum location of the dielectric isolated region 14.

Since the annulus bottom gate contact region 32 extends down to and intersects the bottom gate 22 which itself extends and is connected to the bottom of the source and drain region 16, 18, the bottom gate and bottom gate contact separates the channel region 20 of the island 10 from the remainder from the island 10. Thus, this structure can be used with dielectric or junction isolated regions. This structure also prevents the turning on of a parasitic PMOS of the embodiment of FIGS. 1-3. This PMOS would include the P+ bottom gate 22 and the Schottky top metal 24 as the source and drain regions with the N region forming the body and the possibly biased substrate 12 being the gate with the dielectric isolation 14 forming the gate dielectric. In these other embodiments, the substrate 12 should be connected to a sufficiently positive voltage, at region 34 for example in FIG. 3, such that the PMOS does not turn on.

While the source and drain regions 16, 18 may be formed by diffusion, the bottom gate region 22 is formed by ion implantation. Preferably the bottom gate region of the ion implantation is formed after the source and drain regions so as to not be effected by the high temperature processing of the deposition and diffusion.

The present device is compatible with bipolar processing and requires very few additional steps. These steps would include the ion implantation for the bottom gate 22. The processing of the IC to form the dielectrical isolation as well as preparing the island 10 for Schottky contacts is described in U.S. Pat. No. 4,260,431 to Piotrowski, which is incorporated herein by reference.

The size and location of the source and drain region 16, 18 are selected so as to be displaced from the dielectric isolation 14 so that the $I_{DSS}$ is not effected by the island size variation. As is well known, the island size may vary between 14 min and 14 max as illustrated in FIG. 2. This variation results from the processing used to form the dielectric isolated islands 10. The dimensions of the source and drain regions 16, 18 are selected to assure that they maintain a distance from the dielectric isolation edge 14 min. Similarly, to assure that the top gate 24 and the bottom gate 22 extend out beyond the dielectric isolation 14, both have lateral dimensions which would exceed the anticipated maximum dielectric island dimensions 14 max.

Although the MESFET of FIGS. 1 and 2 has been described as an N-channel device, P-channel devices may also be formed using the same method and dimensions Also, although the top gate 24 has been shown as extending across opposed sides of the dielectric isolation 14 and the bottom gate contact region 32, they may extend across any two sides or one side at two points as long as they divide the island 10 into at least two regions. Thus an L shape top gate would extent across adjacent edges.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A method of manufacturing a MESFET in an island of a first conductivity type isolated by dielectric isolation from a substrate comprising:
   forming source and drain regions of said first conductivity type spaced in said island;
   forming a bottom gate region of a second conductivity type in and below the surface of said island; and
   forming a top gate on said top surface of said island of a material which forms a Schottky barrier therewith continuously across a portion of said island forming a channel between said source drain regions and beyond two sides of said dielectric isolation two points onto said substrate to divide said island into at least two regions.

2. A method according to claim 1, wherein said bottom gate is formed to extend laterally in all directions beyond said dielectric isolation into said substrate.

3. A method according to claim 2, wherein said top and bottom gates are formed to have a lateral dimension greater than a maximum anticipated lateral dimension of said island resulting from a dielectrically isolation process.

4. A method according to claim 1, wherein said bottom gate is formed to intersect said source and drain regions adjacent their bottoms.

5. A method according to claim 1, wherein said bottom gate is formed by ion implantation.

6. A method according to claim 1, including forming a contact region in said substrate.

7. A method of manufacturing a MESFET in an island of a first conductivity type isolated from a substrate comprising:
   forming source and drain regions of said first conductivity type spaced in said island;
   forming a bottom gate region of a second conductivity type in and below the surface of said island and extending laterally beyond said source and drain regions;
   forming a bottom gate contact region of said second conductivity type extending from said surface down to said bottom gate region as an annulus encompassing said source and drain regions; and
   forming a top gate on said top surface of said island of a material which forms a Schottky barrier therewith and extends across a portion of said island forming a channel between said source and drain regions and onto said bottom gate contact regions at two points to divide said island into at least two regions.

8. A method according to claim 7, wherein said bottom gate is formed to intersect said source and drain regions adjacent their bottoms.

9. A method according to claim 7, wherein said bottom gate is formed by ion implantation.

* * * * *